(12) United States Patent
Jeon et al.

(10) Patent No.: US 9,123,852 B2
(45) Date of Patent: Sep. 1, 2015

(54) METHOD AND APPARATUS FOR SENSING BENDING OF FLEXIBLE DISPLAY DEVICE USING MUTUAL INDUCTANCE

(71) Applicants: Jae-Hyeon Jeon, Yongin (KR); Tae-Jin Kim, Yongin (KR); Hae-Kwan Seo, Yongin (KR)

(72) Inventors: Jae-Hyeon Jeon, Yongin (KR); Tae-Jin Kim, Yongin (KR); Hae-Kwan Seo, Yongin (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 155 days.

(21) Appl. No.: 13/788,169

(22) Filed: Mar. 7, 2013

(65) Prior Publication Data

US 2014/0096616 A1    Apr. 10, 2014

(30) Foreign Application Priority Data

Oct. 5, 2012 (KR) .......................... 10-2012-0110689

(51) Int. Cl.
| | |
|---|---|
| *G01L 1/20* | (2006.01) |
| *H01L 33/08* | (2010.01) |
| *G01L 1/00* | (2006.01) |
| *G01L 5/04* | (2006.01) |
| *G09G 3/32* | (2006.01) |
| *G06F 3/041* | (2006.01) |
| *G06F 1/16* | (2006.01) |
| *G06F 3/045* | (2006.01) |

(52) U.S. Cl.
CPC ................ *H01L 33/08* (2013.01); *G01L 1/005* (2013.01); *G01L 1/205* (2013.01); *G01L 5/04* (2013.01); *G09G 3/3208* (2013.01); *G06F 1/1652* (2013.01); *G06F 3/041* (2013.01); *G06F 3/045* (2013.01); *G06F 3/0412* (2013.01); *G06F 3/0414* (2013.01)

(58) Field of Classification Search
CPC ... G06F 3/00412; G06F 3/1652; G06F 3/041; G06F 3/045; G06F 3/0414; G01L 5/04; G01L 1/005; G01L 1/205
USPC .................... 345/173, 174, 156, 87, 104, 36; 73/862.632, 862.621, 862.046, 73/862.045
See application file for complete search history.

(56) References Cited

U.S. PATENT DOCUMENTS

| | | | |
|---|---|---|---|
| 6,751,898 B2 * | 6/2004 | Heropoulos et al. ............ 40/544 |
| 2006/0109391 A1 | 5/2006 | Huitema et al. | |

(Continued)

FOREIGN PATENT DOCUMENTS

| | | | |
|---|---|---|---|
| KR | 10-2007-0094335 A | 9/2007 |
| KR | 10-2010-0023256 A | 3/2010 |

(Continued)

*Primary Examiner* — Lisa Caputo
*Assistant Examiner* — Jonathan Dunlap
(74) *Attorney, Agent, or Firm* — Lee & Morse, P.C.

(57) ABSTRACT

A method of manufacturing a flexible display device for sensing bending that includes forming a lower electrode layer, which includes a plurality of lower electrodes spaced apart from each other on a substrate, forming an insulation layer on the lower electrode layer, forming holes in the insulation layer to expose at least a part of each of the plurality of lower electrodes, and forming an upper electrode layer, which includes a plurality of upper electrodes that are spaced apart from each other on the insulation layer and that fill the holes in the insulation layer. At least two conductive units including the lower electrode layer, the insulation layer, and the upper electrode layer are formed to face each other on a substrate of a non-display unit that is arranged near a boundary of the display device.

20 Claims, 6 Drawing Sheets

(56) References Cited

U.S. PATENT DOCUMENTS

2012/0242610 A1* 9/2012 Yasumatsu .................... 345/173
2012/0248892 A1   10/2012 Covic et al.
2013/0300677 A1* 11/2013 Kim et al. .................... 345/173

FOREIGN PATENT DOCUMENTS

| KR | 10-2012-0055628 A | 5/2012 |
| KR | 10-2012-0065924 A | 6/2012 |

* cited by examiner

METHOD AND APPARATUS FOR SENSING BENDING OF FLEXIBLE DISPLAY DEVICE USING MUTUAL INDUCTANCE

CROSS-REFERENCE TO RELATED PATENT APPLICATION

This application claims priority under 35 U.S.C. §119 to Korean Patent Application No. 10-2012-0110689, filed on Oct. 5, 2012, in the Korean Intellectual Property Office, the disclosure of which is incorporated herein in its entirety by reference.

BACKGROUND

As display-related technology has been developed, flexible display devices have been studied and developed. Further, organic light-emitting displays have superior characteristics, such as wide viewing angles, excellent contrast, short response times, low power consumption, and the like. Organic light-emitting displays also have self light-emitting characteristics and may not include an additional light source. As such, their thickness and weight can be reduced. In addition, the scope of applications from personal portable devices, such as MP3 players, mobile phones, and the like, to TVs has been enlarged for the organic light-emitting displays.

SUMMARY

Embodiments may be realized by providing a method of manufacturing a flexible display device for sensing bending thereof that includes forming a lower electrode layer that includes a plurality of lower electrodes spaced apart from each other on a substrate, forming an insulation layer on the lower electrode layer, forming holes in the insulation layer to expose at least a part of each of the plurality of lower electrodes, and forming an upper electrode layer that includes a plurality of upper electrodes that are spaced apart from each other on the insulation layer and that fill the holes in the insulation layer. At least two conductive units including the lower electrode layer, the insulation layer, and the upper electrode layer are formed to face each other on a substrate of a non-display unit that is arranged near a boundary of the display device.

At least one of the lower electrode layer and the upper electrode layer may include an electrode having a whirlpool pattern that gradually extends farther away from a center point. The at least two conductive units may be formed in coil shapes as the lower electrode layer and the upper electrode layer are connected to each other.

Each of the plurality of lower electrodes may be formed to have a long pattern extending in a first direction of the display device, and each of the plurality of upper electrodes may be formed to have a long pattern inclined at a predetermined angle from the first direction of the display device.

The upper electrode layer may be formed of a same material as source and drain electrodes of a thin film transistor (TFT) of a display unit of the display device, simultaneously with a formation of the source and drain electrodes. The lower electrode layer may be formed of a same material as a gate electrode of the TFT of the display unit of the display device, simultaneously with a formation of the gate electrode.

Each of the plurality of upper electrodes may be connected to at least two of the plurality of lower electrodes through the holes in the insulation layer such that the at least two of the plurality of lower electrodes are electrically connected to each other. Each of the plurality of lower electrodes may be connected to at least two of the plurality of upper electrodes through the holes in the insulation layer such that the at least two of the plurality of upper electrodes are electrically connected to each other, and the at least two conductive units are electrically connected from one ends thereof to other ends thereof.

Embodiments may be realized by providing a flexible display device for sensing bending thereof that includes a lower electrode layer, which includes a plurality of lower electrodes spaced apart from each other on a substrate, an upper electrode layer, which includes a plurality of upper electrodes spaced apart from each other, an insulation layer, which includes a plurality of holes on the lower electrode layer and the plurality of holes expose at least a part of each of the plurality of lower electrodes, and the upper electrode layer is on the insulation layer by filling the plurality of holes. At least two conductive units including the lower electrode layer, the insulation layer, and the upper electrode layer face each other on a substrate of a non-display unit that is arranged near a boundary of the display device.

At least one of the lower electrode layer and the upper electrode layer may include an electrode having a whirlpool pattern that gradually extends farther away from a center point. At least two conductive units may have coil shapes as the lower electrode layer and the upper electrode layer are connected to each other.

Each of the plurality of lower electrodes may have a long pattern extending in a first direction of the display device, and each of the plurality of upper electrodes may have a long pattern inclined at a predetermined angle from the first direction of the display device.

The upper electrode layer may be formed of a same material as source and drain electrodes of a thin film transistor (TFT) of a display unit of the display device, simultaneously with a formation of the source and drain electrodes. The lower electrode layer may be formed of a same material as a gate electrode of the TFT of the display unit of the display device, simultaneously with the formation of the gate electrode.

Each of the plurality of upper electrodes may be connected to at least two of the plurality of lower electrodes through the holes in the insulation layer such that the at least two of the plurality of lower electrodes are electrically connected to each other. Each of the plurality of lower electrodes may be connected to at least two of the plurality of upper electrodes through the holes in the insulation layer such that the at least two of the plurality of upper electrodes are electrically connected to each other, and the at least two conductive units are electrically connected from one ends thereof to other ends thereof.

Embodiments may be realized by providing a bending sensing method that includes inputting a signal to a first conductive unit included in one side of a flexible display device, outputting a signal that is generated in a second conductive unit included in another side of the display device, which other side faces the first conductive unit, by a magnetic flux formed from the signal input to the first conductive unit, and sensing bending of the display device from the signal output from the second conductive unit.

The inputting of the signal to the first conductive unit may include inputting first current to the first conductive unit. The outputting of the signal that is generated in the second conductive may include outputting second current that is generated in the second conductive unit by a magnetic flux formed by a change in a magnitude of the first current. The sensing bending of the display device may include sensing the bending of the display device based on a change in a magnitude of the second current with respect to a change in a distance between the first conductive unit and the second conductive unit, by the bending of the display device.

The method of may include controlling the display device based on the sensed bending of the display device.

Embodiments may also be realized by providing a bending sensing apparatus that includes a signal input unit, which inputs a signal to a first conductive unit included in one side of a flexible display device, a signal output unit, which outputs a signal that is generated in a second conductive unit included in another side of the display device, which other side faces the first conductive unit, by a magnetic flux formed from the signal input to the first conductive unit, and a bending sensing unit, which senses bending of the display device from the signal output from the second conductive unit.

The signal input unit may input first current to the first conductive unit, the signal output unit may output second current that is generated in the second conductive unit by a magnetic flux formed by a change in a magnitude of the first current, and the bending sensing unit may sense the bending of the display device based on a change in a magnitude of the second current with respect to a change in a distance between the first conductive unit and the second conductive unit, by the bending of the display device. The bending sensing apparatus may include a control unit that controls the display device based on the bending of the display device sensed by the bending sensing unit.

BRIEF DESCRIPTION OF THE DRAWINGS

Features will become apparent to one of ordinary skill in the art by describing in detail exemplary embodiments thereof with reference to the attached drawings in which.

DETAILED DESCRIPTION

Hereinafter, embodiments will be described in detail by explaining exemplary embodiments with reference to the attached drawings. Embodiments may, however, be embodied in many different forms and should not be construed as being limited to the embodiments set forth herein; rather, these embodiments are provided so that this disclosure will be thorough and complete, and will fully convey exemplary implementations to one of ordinary skill in the art.

Meanwhile, the terminology used herein is for the purpose of describing particular embodiments and is not intended to be limiting. As used herein, the singular forms are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/ or groups thereof. Also, it will be understood that, although the terms 'first', 'second', etc. may be used herein to describe various elements, these elements should not be limited by these terms. These terms are only used to distinguish one element from another.

Elements in the following drawings may be exaggerated, omitted, or schematically illustrated for conveniences and clarity of explanation, and the sizes of elements do not reflect their actual sizes completely. Expressions such as "at least one of," when preceding a list of elements, modify the entire list of elements and do not modify the individual elements of the list.

Figure 1:
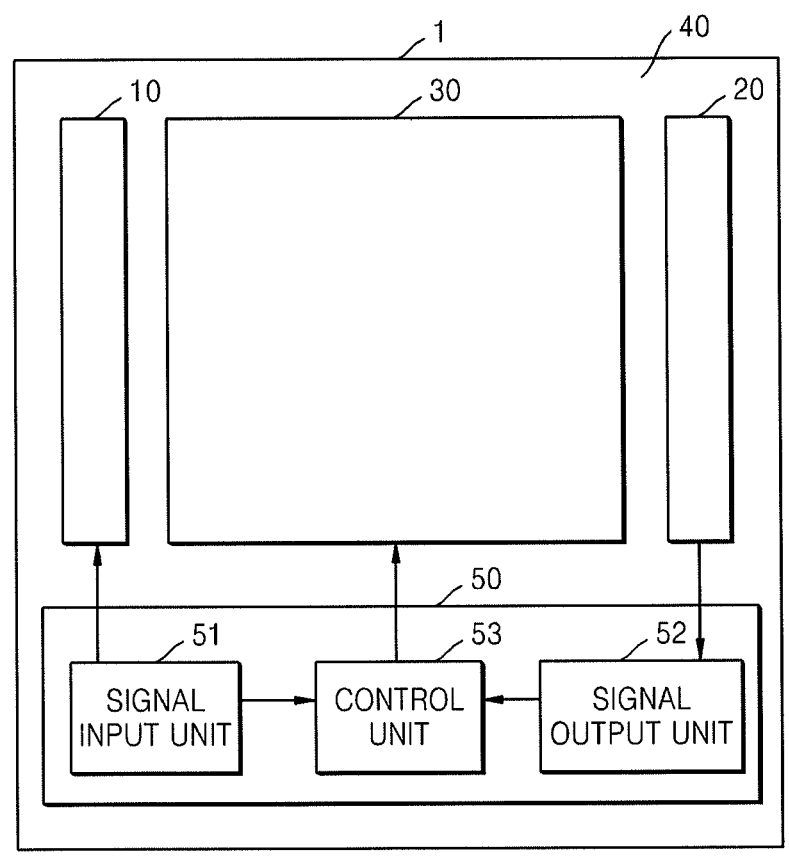
FIG. 1 is a block diagram of a flexible display device according to an exemplary embodiment.

FIG. 1 is a block diagram of a flexible display device 1 according to an embodiment. Referring to FIG. 1, the display device 1 according to an embodiment may include a first conductive unit 10, a second conductive unit 20, a display unit 30 that displays an image, a non-display unit 40 that does not display an image, and a driving unit 50. The display unit 30 may include a plurality of pixels.

Although the display device 1 may have a flat shape, the display device 1 may be modified in a 3D shape owing to its flexibility. According to an embodiment, bending of the display device 1 may be sensed using the first conductive unit 10 and the second conductive unit 20. In this regard, the sensing of the bending may be sensing of information such as a bending degree, a bending direction, etc. but embodiments are not limited thereto.

At least two conductive units, such as the first conductive unit 10 and the second conductive unit 20, may be formed to face each other on a substrate of both sides of the non-display unit 40 of the display device 1, e.g., as shown in FIG. 1.

For example, referring to FIG. 1, the first conductive unit 10 and the second conductive unit 20 may be formed to face each other at left and right sides of the non-display unit 40 of the display device 1. For descriptive convenience, although FIG. 1 shows an example in which the first conductive unit 10 and the second conductive unit 20 are formed at the left and right sides of the non-display unit 40 of the display device 1, the first conductive unit 10 and the second conductive unit 20 may be formed to face each other at upper and lower ends of the non-display unit 40 of the display device 1. Also, four or more conductive units may be formed in a manner of forming the first conductive unit 10 and the second conductive unit 20 at the left and right sides of the non-display unit 40 and forming a third conductive unit (not shown) and a second conductive unit (not shown) at the upper and lower ends of the non-display unit 40, respectively.

A pair of the first conductive unit 10 and the second conductive unit 20 may sense bending of the display device 1. For example, the pair of conductive units may sense the bending of the display device 1 using a mutual inductance phenomenon.

For example, the first conductive unit 10 and the second conductive unit 20 disposed in the left and right sides of the display device 1 may sense left and right bending of the display device 1, and the third conductive unit and the second conductive unit disposed at the upper and lower ends sides of the display device 1, respectively, may sense up and down bending of the display device 1.

In addition, various numbers of conductive units may be appropriately formed at various locations of the non-display unit 40 of the display device 1 according to the circumstance in which the bending is to be sensed or the circumstance in which embodiments are to be implemented, and thus various bending of the display device 1. Furthermore, the 3D shape of the display device 1 may be sensed based on information regarding the sensed bending.

Each of the conductive units, such as the first conductive unit 10 and the second conductive unit 20, may include a lower electrode layer, an insulation layer, and an upper electrode layer. The lower electrode layer may include a plurality of lower electrodes spaced apart from each other. The insulation layer may include a plurality of holes formed to expose at least a part of each of the lower electrodes and may be formed on the lower electrode layer. The upper electrode layer may be formed on the insulation layer by filling the holes of the insulation layer and may include a plurality of upper electrodes spaced apart from each other. Examples of detailed constructions of the conductive units will now be described with reference to the following figures.

Figure 2A:
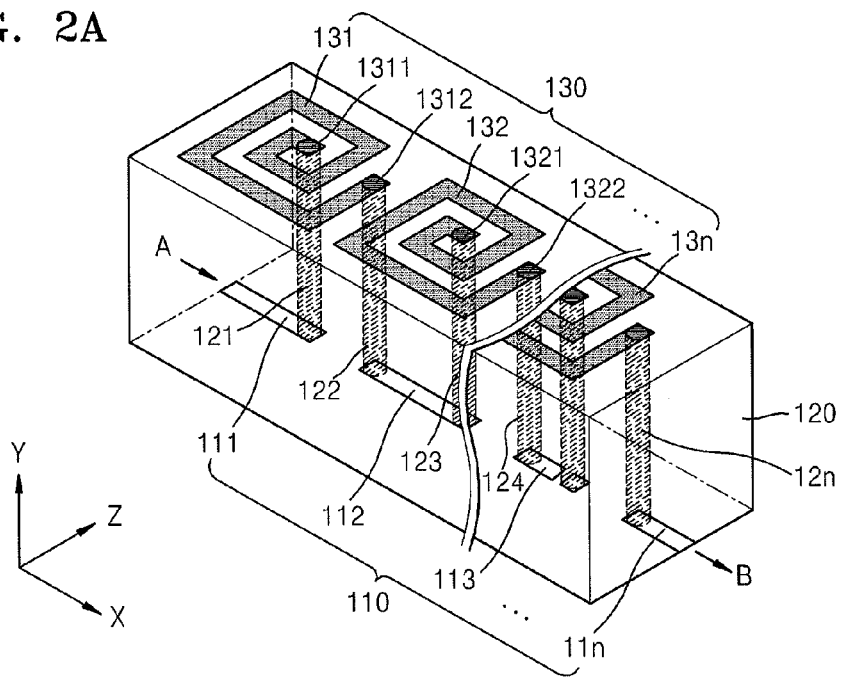
FIGS. 2A through 2C are perspective, rear, and plan views, respectively, of an example of a conductive unit.
Figure 2B:
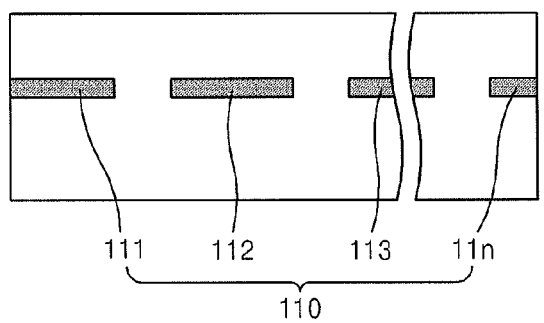
Figure 2C:
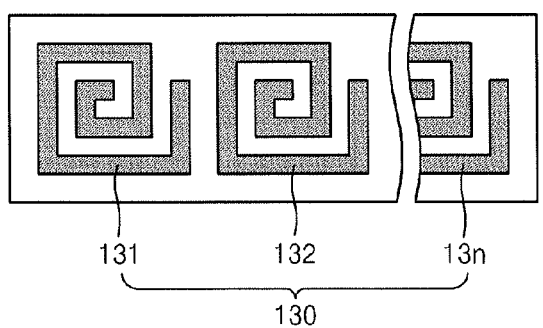

FIGS. 2A through 2C are perspective, rear, and plan views of an example of a conductive unit, respectively. Referring to FIGS. 2A through 2C, the conductive unit may include a lower electrode layer 110, an insulation layer 120, and an upper electrode layer 130.

FIG. 2A is a perspective view of the example of the conductive unit. The lower electrode layer 110 may include a plurality of lower electrodes 111, 112, 113, . . . , 11n spaced apart from each other. The insulation layer 120 may be formed on the lower electrode layer 110 so that the insulation layer 120 may fill the space between the lower electrode layer 110 and the upper electrode layer 130. The insulation layer 120 may include a plurality of holes 121, 122, 123, 124, . . . , 12n to expose at least a part of each of the lower electrodes 111, 112, 113, . . . , 11n. For example, each of the plurality of holes 121, 122, 123, 124, . . . , 12n may expose one end of one of the lower electrodes 111, 112, 113, . . . , 11n. The upper electrode layer 130 may be formed on the insulation layer 120 by filling the holes 121, 122, 123, 124, . . . , 12n of the insulation layer 120 and forming a plurality of upper electrodes 131, 132, 133, 134, . . . , 13n, e.g., on a side of the insulation layer 120, spaced apart from each other.

FIG. 2B is a rear view of the example of the conductive unit, and shows the lower electrode layer 110. The lower electrode layer 110 may include the lower electrodes 111, 112, 113, . . . , 11n patterned in predefined shapes. Although the lower electrodes 111, 112, 113, . . . , 11n have a tight line shape in FIG. 2B, embodiments are not limited thereto. For example, the lower electrodes 111, 112, 113, . . . , 11n may have various patterns according to a shape of the conductive unit. The lower electrodes 111, 112, 113, . . . , 11n may be spaced apart from each other to form the lower electrode layer 110.

FIG. 2C is a plan view of the example of the conductive unit, and shows the upper electrode layer 130. The upper electrode layer 130 may include the upper electrodes 131, 132, 133, 134, . . . , 13n patterned in predefined shapes. Although the upper electrodes 131, 132, 133, 134, . . . , 13n may have a whirlpool pattern that gradually extends away from a center point in a rotational pattern in FIG. 2C, this is merely an exemplary embodiment, and embodiments are not limited thereto. For example, the upper electrodes 131, 132, 133, 134, . . . , 13n may have various patterns.

In a case where the magnitude of a current that flows through an electrode having a shape such as the whirlpool pattern changes, the electrode may generate a magnetic flux in a uniform direction according to Faraday's law. The pattern of the upper electrodes 131, 132, 133, 134, . . . , 13n is not limited to the whirlpool patterns, and may be modified in various ways within a range of a pattern that may generate a magnetic flux having predetermined magnitude other than 0, e.g., due to a change in the magnitude of current that flows through the upper electrodes 131, 132, 133, 134, . . . , 13n.

Referring to FIG. 2A, the insulation layer 120 of the conductive unit may be formed on the lower electrode layer 110 and include the holes 121, 122, 123, 124, . . . , 12n to expose at least a part of each of the lower electrodes 111, 112, 113, . . . , 11n.

Each of the upper electrodes 131, 132, 133, 134, . . . , 13n may be connected to at least two of the lower electrodes 111, 112, 113, . . . , 11n through the holes 121, 122, 123, 124, . . . , 12n so that each of the upper electrodes 131, 132, 133, 134, . . . , 13n may electrically connect the at least two of the lower electrodes 111, 112, 113, . . . , 11n. For example, the upper electrode 131 electrically connects the lower electrodes 111 and 112 through the holes 121 and 122.

For example, one end 1311 of the upper electrode 131 is formed at a location of the hole 121 according to formation of a pattern of the upper electrode 131. The upper electrode 131 has a whirlpool pattern that is gradually far away from a center point that is the location of the hole 121 and rotates, e.g., the location of the hole 121 corresponds to a center of the whirlpool pattern. The whirlpool pattern is formed to have another end 1312 of the upper electrode 131. The other end 1312 of the upper electrode is formed at a location of the hole 122, e.g., the location of the hole 122 may correspond to an end of the whirlpool pattern such that the whirlpool pattern extends between the holes 121 and 122.

The holes 121 and 122 are filled with a material forming the upper electrode layer 130 when the upper electrode layer 130 is formed, and thus one end 1311 of the upper electrode 131 is electrically connected to the hole 121, and another end 1312 thereof is electrically connected to the hole 122. The hole 121 is connected to the lower electrode 111, and the hole 122 is connected to the lower electrode 112, so that the upper electrode 131 electrically connects the lower electrodes 111 and 112. In this way, each of the upper electrodes 131, 132, 133, 134, . . . , 13n may electrically connect the neighboring two of the lower electrodes 111, 112, 113, . . . , 11n by using the holes 121, 122, 123, 124, . . . , 12n formed in the insulation layer 120.

Also, each of the lower electrodes 111, 112, 113, . . . , 11n is connected to the at least two of the upper electrodes 131, 132, 133, 134, . . . , 13n through the holes 121, 122, 123, 124, . . . , 12n so that the each of the lower electrodes 111, 112, 113, . . . , 11n may electrically connect the at least two of the upper electrodes 131, 132, 133, 134, . . . , 13n. For example, at least two regions of the lower electrode 112 may be exposed by the holes 122 and 123. The regions of the lower electrode 112 exposed by the holes 122 and 123 may contact the material forming the upper electrode layer 130 filled in the holes 122 and 123. Accordingly, a part of the lower electrode 112 exposed by the holes 122 and 123 may be electrically connected to the material forming the upper electrode layer 130.

As a result, the lower electrode 112 electrically connects the upper electrodes 131 and 132. In this way, each of the lower electrodes 111, 112, 113, . . . , 11n may electrically connect the neighboring two of the upper electrodes 131, 132, 133, 134, . . . , 13n by using the holes 121, 122, 123, 124, . . . , 12n formed in the insulation layer 120. As described above, the lower electrodes electrically connect the neighboring upper electrodes, and the upper electrodes also electrically connect the neighboring lower electrodes so that one end of the conductive unit and another end thereof are electrically connected to each other. For example of FIG. 2A, in a case where current flows through the lower electrode 111, the current may flow from the lower electrode 111 to the lower electrode 11n through the hole 121, the upper electrode 131, the hole 122, the lower electrode 112, the hole 123, the upper electrode 132, the hole 124, the lower electrode 113, . . . , the upper electrode 13n, and the hole 12n.

As described above, when current having variable magnitude flows through the electrode having the whirlpool pattern, the electrode may generate a magnetic flux in a uniform direction. Referring to FIG. 2A, in a case where alternating current flows through the lower electrode 111, the alternating current may flow to the lower electrode 11n through the upper electrodes 131, 132, 133, 134, . . . , 13n. In this regard, each of the upper electrodes 131, 132, 133, 134, . . . , 13n may generate the magnetic flux in a positive direction or in a negative direction of an axis y. Magnitude of the magnetic flux may vary with respect to a change of the magnitude of the alternating current.

An example of a conductor pattern shown in FIGS. 2A through 2C may be applied to the first conductive unit 10 and the second conductive unit 20. Also, although FIGS. 2A through 2C show the examples of the upper electrodes 131, 132, 133, 134, . . . , 13n having the whirlpool pattern, and the lower electrodes 111, 112, 113, . . . , 11n having the tight line pattern, the patterns of the upper electrode layer 130 and the lower electrode layer 110 shown in FIGS. 2A through 2C may be exchanged with respect to each other. For example, the lower electrodes 111, 112, 113, . . . , 11n of the conductive unit may have the whirlpool pattern shown in FIG. 2C, and the upper electrodes 131, 132, 133, 134, . . . , 13n of the conductive unit may have the tight line pattern shown in FIG. 2B. Also, all of the lower electrodes 111, 112, 113, . . . , 11n and the upper electrodes 131, 132, 133, 134, . . . , 13n may have the whirlpool pattern shown in FIG. 2C.

In FIGS. 2A through 2C, parameters such as spaces between the holes 121, 122, 123, 124, . . . , 12n, spaces between the lower electrodes 111, 112, 113, . . . , 11n, and spaces between the upper electrodes 131, 132, 133, 134, . . . , 13n, a height of the insulation layer 120, spaces between coiled electrodes with respect to the whirlpool pattern, a coiling number, and the like may be set in various ways according to the circumstance in which the an embodiment is to be implemented. Thus, a characteristic of the magnetic flux generated by the conductive unit may be controlled by appropriately setting values of the parameters.

For example, in a case where it is sought to more accurately sense the magnetic flux by increasing magnitude of the magnetic flux, the whirlpool pattern may be more densely formed. According to another exemplary embodiment, a whirlpool pattern in which all of the lower electrodes 111, 112, 113, . . . , 11n and the upper electrodes 131, 132, 133, 134, . . . , 13n are coiled in the same direction may be provided, so that all of the lower electrodes 111, 112, 113, . . . , 11n and the upper electrodes 131, 132, 133, 134, . . . , 13n may generate the magnetic flux. In addition, a pattern of the conductive unit may be formed in various ways according to the various circumstances.

Figure 3A:
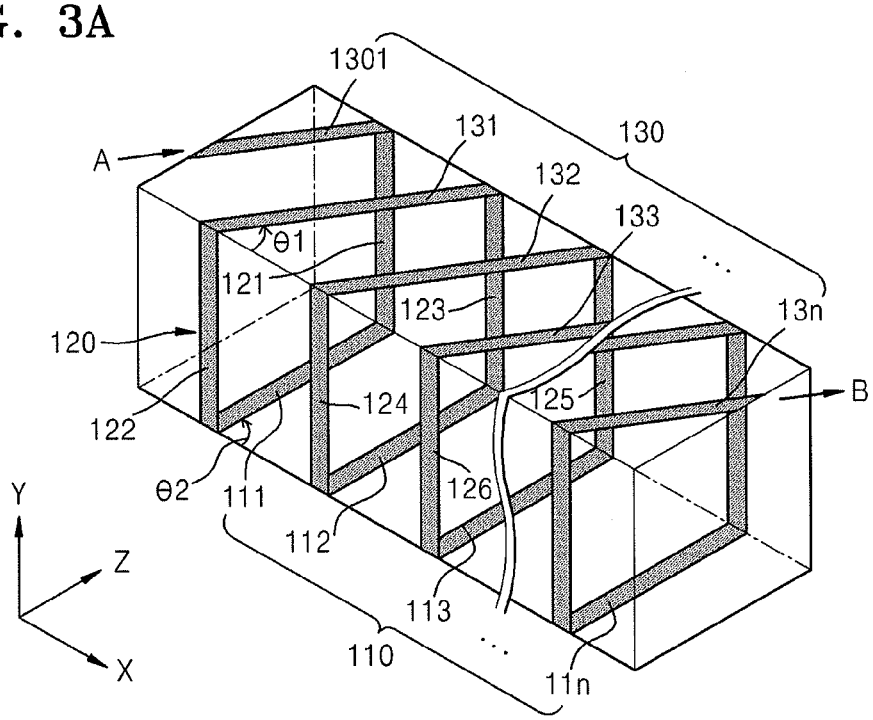
FIGS. 3A through 3C are perspective, rear, and plan views, respectively, of an example of a conductive unit.
Figure 3B:
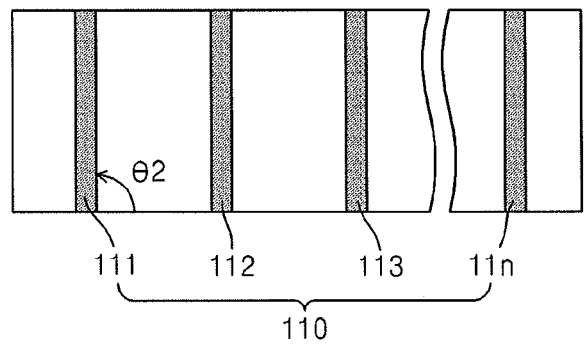
Figure 3C:
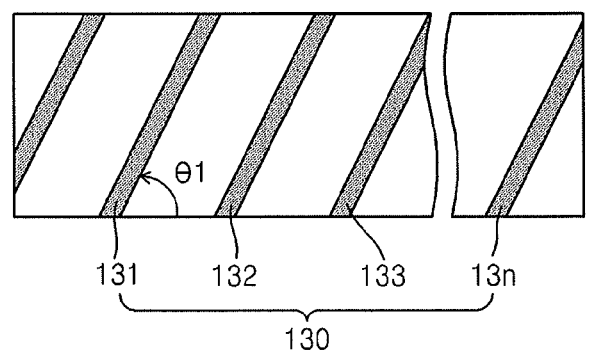

FIGS. 3A through 3C are perspective, rear, and plan views of an example of a conductive unit, respectively. Referring to FIGS. 3A through 3C, the conductive unit may also include the lower electrode layer 110, the insulation layer 120, and the upper electrode layer 130.

FIG. 3A is a perspective view of another example of the conductive unit. The lower electrode layer 110 may include the plurality of lower electrodes 111, 112, 113, . . . spaced apart from each other. The insulation layer 120 may be formed on the lower electrode layer 110 so that the insulation layer 120 may fill the lower electrode layer 110 and the upper electrode layer 130. The insulation layer 120 may include the plurality of holes 121, 122, 123, 124, 125, 126, . . . to expose at least a part of each of the lower electrodes 111, 112, 113, . . . . The upper electrode layer 130 may be formed on the insulation layer 120 by filling the holes 121, 122, 123, 124, 125, 126, . . . of the insulation layer 120 and include the plurality of upper electrodes 1301, 131, 132, 133, . . . , 13n spaced apart from each other.

FIG. 3B is a rear view of another example of the conductive unit, and shows the lower electrode layer 110. The lower electrode layer 110 may include the lower electrodes 111, 112, 113, . . . patterned in predefined shapes. FIG. 3B shows the example in which the lower electrodes 111, 112, 113, . . . have a long bar pattern and are parallel to each other. The bar pattern may be long formed from a first direction to a direction of an angle θ2 as shown in FIG. 3B. Although the angle θ2 may be 90 degrees, embodiments are not limited thereto. In this regard, the first direction may be a length direction of the conductive unit that may be an x-axis direction as shown in FIG. 3A. Also, if the angle θ2 is 90 degrees, a direction from the first direction to the direction of the angle θ2 may be a z-axis direction.

For example of the case where the conductive unit is formed vertically at both sides of the display device 1, when the angle θ2 is 90 degrees, the lower electrodes 111, 112, 113, . . . may have the long bar pattern having a length direction disposed in a first direction of the display unit 20 of the display device 1. The lower electrodes 111, 112, 113, . . . may be spaced apart from each other to form the lower electrode layer 110. In this regard, the first direction may be the z-axis direction as shown in FIG. 3A.

FIG. 3C is a plan view of another example of the conductive unit, and shows the upper electrode layer 130. The upper electrode layer 130 may include the upper electrodes 1301, 131, 132, 133, . . . , 13n patterned in predefined shapes. Each of the upper electrodes 1301, 131, 132, 133, . . . , 13n may have a long pattern in which the upper electrodes 1301, 131, 132, 133, . . . , 13n are disposed in a direction inclined at a predefined angle from the first direction of the display device 1. The upper electrodes 1301, 131, 132, 133, . . . , 13n may be formed long from the length direction of the conductive unit to a direction of an angle θ1. The angles θ1 and θ2 may differ from each other. For example, although the angle θ1 may be smaller than the angle θ2, the embodiments are not limited thereto. In this regard, the first direction may be the z-axis direction as shown in FIG. 3A.

Referring to FIG. 3A, the insulation layer 120 of the conductive unit may be formed on the lower electrode layer 110 and include the holes 121, 122, 123, 124, 125, 126, . . . , 12n to expose at least a part of each of the lower electrodes 111, 112, 113, . . . .

Each of the upper electrodes 1301, 131, 132, 133, . . . , 13n may be connected to at least two of the lower electrodes 111, 112, 113, . . . through the holes 121, 122, 123, 124, 125, 126, . . . so that each of the upper electrodes 1301, 131, 132, 133, . . . , 13n may electrically connect the at least two of the lower electrodes 111, 112, 113, . . . . For example, the upper electrode 131 electrically connects the lower electrodes 111 and 112 through the holes 122 and 123, respectively. Accordingly, the upper electrode 131 electrically connects the lower electrodes 111 and 112.

Also, each of the lower electrodes 111, 112, 113, . . . is connected to the at least two of the upper electrodes 1301, 131, 132, 133, . . . , 13n through the holes 121, 122, 123, 124, 125, 126, . . . so that the each of the lower electrodes 111, 112, 113, . . . may electrically connect the at least two of the upper electrodes 1301, 131, 132, 133, . . . , 13n. For example, at least two regions of the lower electrode 112 may be exposed by the holes 123 and 124. The regions of the lower electrode 112 exposed by the holes 123 and 124 may contact a material forming the upper electrode layer 130 filled in the holes 123 and 124. Accordingly, a part of the lower electrode 112 exposed by the holes 123 and 124 may be electrically connected to the material forming the upper electrode layer 130. The hole 123 is connected to the upper electrode 131, and the hole 124 is connected to the upper electrode 132, so that the lower electrode 112 electrically connects the upper electrodes 131 and 132. In this way, each of the lower electrodes 1111, 112, 113, ... may electrically connect the neighboring two of the upper electrodes 1301, 131, 132, 133, ..., 13n by using the holes 121, 122, 123, 124, 125, 126, ... formed in the insulation layer 120.

For descriptive convenience, although the holes 121, 122, 123, 124, 125, 126, ... are formed in a boundary of the insulation layer 120 in FIG. 3A, the holes 121, 122, 123, 124, 125, 126, ... are may not be formed only in the boundary of the insulation layer 120, and may be formed inward away from the boundary of the insulation layer 120 by a predefined distance. In addition, locations of the holes 121, 122, 123, 124, 125, 126, ... may be patterned in various ways within a range that the lower electrodes 1111, 112, 113, ... electrically connect the neighboring two of the upper electrodes 1301, 131, 132, 133, ..., 13n through the holes 121, 122, 123, 124, 125, 126, ..., and the upper electrodes 1301, 131, 132, 133, ..., 13n electrically connect the neighboring two of the lower electrodes 1111, 112, 113, ... through the holes 121, 122, 123, 124, 125, 126, ....

As described above, the lower electrodes 1111, 112, 113, ... electrically connect the neighboring upper electrodes 1301, 131, 132, 133, ..., 13n through the holes 121, 122, 123, 124, 125, 126, ..., and the upper electrodes 1301, 131, 132, 133, ..., 13n also electrically connect the neighboring lower electrodes 1111, 112, 113, ... through the holes 121, 122, 123, 124, 125, 126, ... so that one end of the conductive unit and another end thereof are electrically connected to each other. For example of FIG. 3A, in a case where current flows through the upper electrode 1301 in a direction A, the current may flow through the upper electrode 13n in a direction B in the order of the lower electrode 111, the hole 122, the upper electrode 131, the hole 123, the lower electrode 112, the hole 124, the upper electrode 132, the hole 125, the lower electrode 113, the hole 126, and the upper electrode 131.

Such path through which the current flows from one end of the conductive unit to another end thereof may be a path of a coil pattern. That is, the lower electrode layer 110 and the upper electrode layer 130 of the conductive unit are connected through the holes 121, 122, 123, 124, 125, 126, ... so that the conductive unit may be formed in a coil shape.

In a case where magnitude of current flowing through an electrode changes, the electrode having the coil pattern may generate a magnetic flux in a uniform direction according to Faraday's Law. For example, if alternating current flows through the conductive unit having the pattern of FIG. 3A, the conductive unit may generate the magnetic flux in a positive direction or in a negative direction of an axis x. Magnitude of the magnetic flux may vary with respect to a change of the magnitude of the alternating current.

An example of a conductor pattern shown in FIGS. 3A through 3C may be applied to the first conductive unit 10 and the second conductive unit 20. Also, although FIGS. 3A through 2C show the examples of the upper electrodes 1301, 131, 132, 133, ..., 13n having the long pattern formed from the length direction of the conductive unit to the direction of θ1, and the lower electrodes 111, 112, 113, ... having the long pattern formed from the length direction of the conductive unit to the direction of θ2, the patterns of the upper electrode layer 130 and the lower electrode layer 110 shown in FIGS. 3A through 2C may be exchanged to each other. For example, the lower electrodes 111, 112, 113, ... of the conductive unit may have the long pattern formed from the length direction of the conductive unit to the direction of θ1, and the upper electrodes 1301, 131, 132, 133, ..., 13n of the conductive unit may have the long pattern formed from the length direction of the conductive unit to the direction of θ2.

The angles θ1 and θ2 may have different values. Accordingly, the upper electrodes 1301, 131, 132, 133, ..., 13n and the lower electrodes 111, 112, 113, ... may be connected across to each other through vertically perforated holes. The detailed connection structure was described above.

In FIGS. 3A through 3C, parameters such as spaces between the holes 121, 122, 123, 124, 125, 126, ..., spaces between the lower electrodes 111, 112, 113, ..., and spaces between the upper electrodes 1301, 131, 132, 133, ..., 13n, a height of the insulation layer 120, the angles θ1 and θ2 formed by the upper electrodes 1301, 131, 132, 133, ..., 13n and the lower electrodes 111, 112, 113, ... that are inclined in the length direction of the conducive unit, respectively, and the like may be set in various ways according to a circumstance in which an embodiment is to be implemented. Thus, a characteristic of the magnetic flux generated by the conductive unit may be controlled by appropriately setting values of the parameters.

For example, in a case where it is sought to more accurately sense the magnetic flux by increasing magnitude of the magnetic flux, the coiling number per unit area of a coil may be adjusted by more densely forming the spaces between the lower electrodes 111, 112, 113, ..., or the spaces between the upper electrodes 1301, 131, 132, 133, ..., 13n. In addition, a pattern of the conductive unit may be formed in various ways according to various circumstances.

Figure 4A:
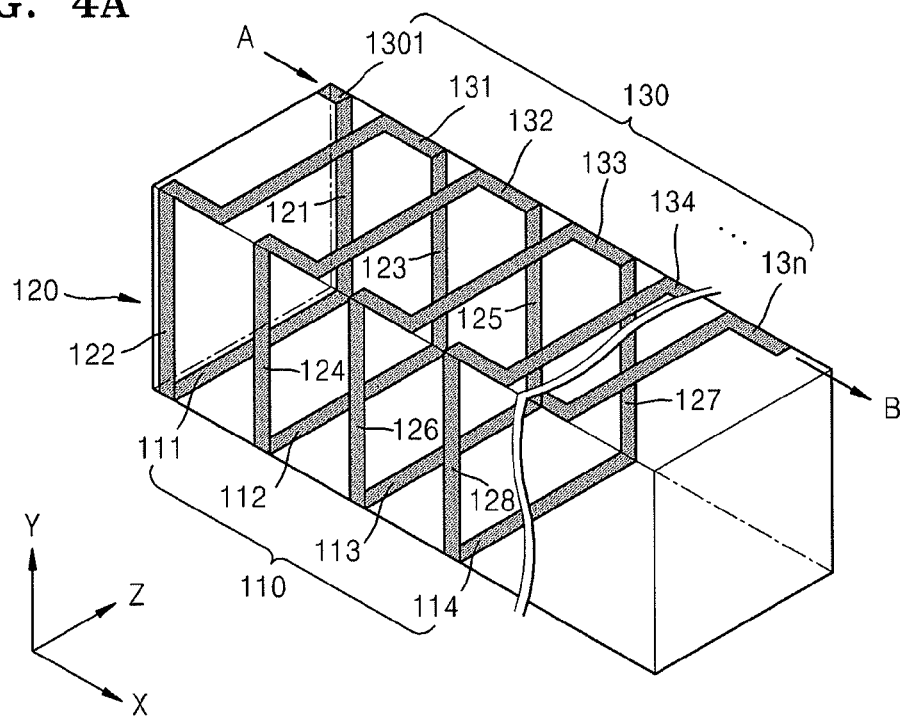
FIGS. 4A through 4C are perspective, rear, and plan views, respectively, of an example of a conductive unit.
Figure 4B:
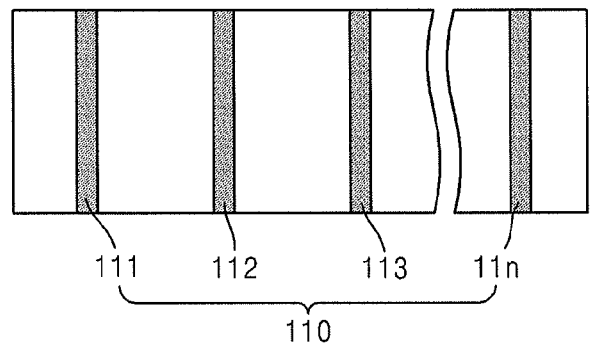
Figure 4C:
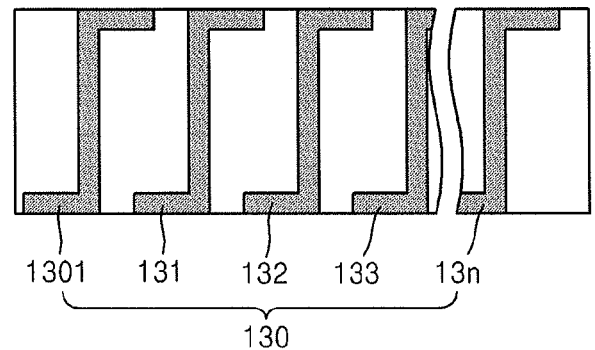

FIGS. 4A through 4C are perspective, rear, and plan views of another example of a conductive unit, respectively. Referring to FIGS. 4A through 4C, the conductive unit may also include the lower electrode layer 110, the insulation layer 120, and the upper electrode layer 130.

FIG. 4A is a perspective view of another example of the conductive unit. The lower electrode layer 110 may include the plurality of lower electrodes 111, 112, 113, 114, ... spaced apart from each other. The insulation layer 120 may be formed on the lower electrode layer 110 so that the insulation layer 120 may fill the lower electrode layer 110 and the upper electrode layer 130. The insulation layer 120 may include the plurality of holes 121, 122, 123, 124, 125, 126, 127, 128, ... to expose at least a part of each of the lower electrodes 111, 112, 113, 114, .... The upper electrode layer 130 may be formed on the insulation layer 120 by filling the holes 121, 122, 123, 124, 125, 126, 127, 128, ... of the insulation layer 120 and include the plurality of upper electrodes 1301, 131, 132, 133, 134, ..., 13n spaced apart from each other.

FIG. 4B is a rear view of another example of the conductive unit, and shows the lower electrode layer 110. The lower electrode layer 110 may include the lower electrodes 111, 112, 113, 114, ... patterned in predefined shapes. FIG. 4B shows the example in which the lower electrodes 111, 112, 113, 114, ... have a long bar pattern and are parallel to each other.

FIG. 4C is a plan view of another example of the conductive unit, and shows the upper electrode layer 130. The upper electrode layer 130 may include the upper electrodes 1301, 131, 132, 133, 134, ..., 13n patterned in predefined shapes. Each of the upper electrodes 1301, 131, 132, 133, 134, ..., 13n may have a stepwise bent pattern. Although the first and last upper electrodes 1301 and 13n have a tight line pattern in FIG. 4C for illustrative convenience, the first and last upper electrodes 1301 and 13n may have the same pattern as those of the other upper electrodes.

Referring to FIG. 4A, the insulation layer 120 of the conductive unit may be formed on the lower electrode layer 110 and include the holes 121, 122, 123, 124, 125, 126, 127, 128, ... to expose at least a part of each of the lower electrodes 111, 112, 113, 114, ....

A structure of the lower electrodes 111, 112, 113, 114, ... that electrically connect the neighboring upper electrodes 1301, 131, 132, 133, 134, ..., 13n and the upper electrodes 1301, 131, 132, 133, 134, ..., 13n that also electrically connect the neighboring lower electrodes 111, 112, 113, 114, ... through the holes 121, 122, 123, 124, 125, 126, 127, 128, ... may be the same as described with reference to the conductive unit of FIG. 3 and thus a detailed description thereof is omitted.

In a case where current flows through the upper electrode 1301 in the direction A, the current may flow through the upper electrode 13n in the direction B in the order of the hole 121, the lower electrode 111, the hole 122, the upper electrode 131, the hole 123, the lower electrode 112, the hole 124, the upper electrode 132, the hole 125, the lower electrode 113, the hole 126, the upper electrode 133, the hole 127, the lower electrode 114, the hole 128, and the upper electrode 134. Referring to FIG. 4A, a path through which the current flows from one end of the conductive unit to another end thereof may be a path of a coil pattern as shown in FIG. 3A.

Accordingly, if current flows through the conductive unit having the pattern of FIG. 4A, the conductive unit may generate a magnetic flux in a positive direction or in a negative direction of an axis y. Magnitude of the magnetic flux may vary with respect to a change of the magnitude of the current. For example, the current may be an alternating current having variable magnitude over time.

An example of the conductor pattern shown in FIGS. 3A through 3C may be applied to the first conductive unit 10 and the second conductive unit 20. Also, the patterns of the upper electrode layer 130 and the lower electrode layer 110 shown in FIGS. 3A through 3C may be exchanged to each other. For example, the lower electrodes 111, 112, 113, 114, ... of the conductive unit may have a stepwise bent pattern, and the upper electrodes 1301, 131, 132, 133, 134, ..., 13n thereof may have a long bar pattern and may be parallel to each other. According to another exemplary embodiment, all of the upper electrodes 1301, 131, 132, 133, 134, ..., 13n and the lower electrodes 111, 112, 113, 114, ... may have the stepwise bent pattern. Accordingly, the upper electrodes 1301, 131, 132, 133, 134, ..., 13n and the lower electrodes 111, 112, 113, 114, ... may be connected across to each other through vertically perforated holes.

In FIGS. 4A through 4C, parameters such as spaces between the lower electrodes 111, 112, 113, 114, ..., spaces between the upper electrodes upper electrodes 1301, 131, 132, 133, 134, ..., 13n, a height of the insulation layer 120, a length of each part in the stepwise bent pattern, and the like may be set in various ways according to a circumstance in which an embodiment is to be implemented. Thus, a characteristic of the magnetic flux generated by the conductive unit may be controlled by appropriately setting values of the parameters.

For example, in a case where it is sought to effectively sense the magnetic flux by increasing a resolution, the magnitude of the magnetic flux may increase by more densely forming the spaces between the lower electrodes 111, 112, 113, 114, ... or the spaces between the upper electrodes upper electrodes 1301, 131, 132, 133, 134, ..., 13n and adjusting the coiling number for unit area. In addition, a pattern of the conductive unit may be formed in various ways according to various circumstances.

The lower electrode layer 110 and the upper electrode layer 130 of the conductive unit may be formed by film-forming a conductive material and patterning the film-formed conductive material through dry etching or wet etching.

The lower electrode layer 110 of the conductive unit may be formed of the same material as that of a gate electrode of a TFT of the display unit 30 of the display device 1 simultaneously with the formation of the gate electrode. The gate electrode may be formed of metal such as Al, Mo, Au, Pt/Pd, Cu, etc. However, embodiments are not limited thereto, e.g., the gate electrode may be coated with a resin paste including these metals in powder form and use a conductive polymer.

The upper electrode layer 130 of the conductive unit may be formed of the same material as those of drain and source electrodes of the TFT of the display unit 30 of the display device 1 simultaneously with the formation of the drain and source electrodes. The drain and source electrodes may be formed of metal such as Al, Mo, Au, Pt/Pd, Cu, etc. However, embodiments are not limited thereto. The drain and source electrodes may be coated with a resin paste including these metals in powder form and use a conductive polymer.

The lower electrode layer 110 and the upper electrode layer 130 may be formed of the same materials as those of any layers formed of the conductive material of the display unit 30 of the display device 1, e.g., as well as the gate electrode or the source and drain electrodes.

At least one of the lower electrode layer 110 and the upper electrode layer 130 may be formed of a compliant electrode. The compliant electrode may be formed by coating and drying a paste including a conductive oxide such as indium tin oxide (ITO), conductive particles such as metal particles, a conductive polymer, a carbon nano tube, etc. on an electroactive polymer layer 212. The paste may be coated by using a spray method, a screen printing method, an inkjet method, a spin coating method, etc. Accordingly, the conductive unit may be compliant.

The insulation layer 120 of the conductive unit and holes formed in the insulation layer 120 may be formed by film-forming a conductive material and patterning the film-formed conductive material through dry etching or wet etching.

The insulation layer 120 of the conductive unit may be formed of the same material as that of at least one of a gate insulation layer, an interlayer insulation layer, a passivation layer, and a pixel defining layer of the TFT of the display unit 30 of the display device 1, e.g., simultaneously with the formation of at least one of the gate insulation layer, the interlayer insulation layer, the passivation layer, and the pixel defining layer. The gate insulation layer, the interlayer insulation layer, the passivation layer, and the pixel defining layer may include insulators that may have a monolayer structure or a multilayer structure and may be formed as organic materials, inorganic materials, or composites of organic materials and inorganic materials.

Like the examples of FIGS. 3A and 4A, in a case where the first conductive unit 10 and the second conductive unit 20 are formed in a coil pattern, the insulation layer 120 of each of the first conductive unit 10 and the second conductive unit 20 may include an iron core in order to effectively transfer a magnetic field formed by the first conductive unit 10 to the second conductive unit 20. Also, the iron core included in the insulation layer 120 of each of the first conductive unit 10 and the second conductive unit 20 may be formed to continuously surround the non-display unit 40 of the display device 1.

Referring to FIG. 1, the driving unit 50 may include a signal input unit 51, a signal output unit 52, and a control unit 53. The signal input unit 51 may input a signal to the first conductive unit 10 included in one side of the display device 1. The signal output unit 52 may output a signal generated by the second conductive unit 20 included in another side of the display device 1 facing the first conductive unit 10 by a magnetic flux formed from the signal input to the first conductive unit 10. The control unit 53 may control the display unit 30 based on the signal input by the signal input unit 51 and the signal output by the signal output unit 52.

Figure 5:
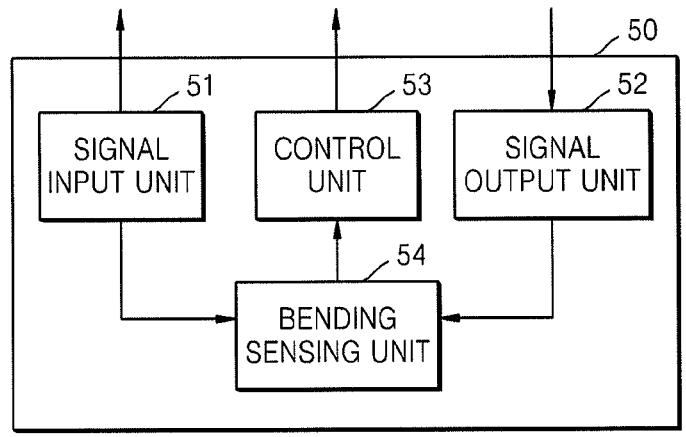
FIG. 5 is a block diagram of another example of a driving unit of FIG. 1.

FIG. 5 is a block diagram of another example of the driving unit 50 of FIG. 1. Referring to FIG. 5, the driving unit 50 may include the signal input unit 51, the signal output unit 52, the control unit 53, and a bending sensing unit 54.

The signal input unit 51 may input a signal to the first conductive unit 10 included in one side of the display device 1. For example, the signal input unit 51 may input an electrical signal to the first conductive unit 10. The electrical signal may be a signal having a continuously variable physical amount such as current, voltage, and the like. Also, the electrical signal may be an alternating signal with a frequency that vibrates. For example, if the signal input unit 51 may input alternating current to the first conductive unit 10, the first conducive unit may generate a magnetic flux having magnitude and direction. In this regard, the magnetic flux may be generated in proportional to a temporal variation of the alternating current input to the first conducive unit 10.

The signal output unit 52 may output a signal generated by the second conductive unit 20 included in another side of the display device 1 facing the first conductive unit 10 by a magnetic flux formed from the signal input to the first conductive unit 10. For example, the signal output unit 52 may output an electrical signal to the second conductive unit 20 by the magnetic flux formed from the electrical signal input to the first conductive unit 10. The electrical signal may be a signal having a continuously variable physical amount such as current, voltage, and the like. For example, if the signal input unit 51 inputs the alternating current to the first conductive unit 10, the first conductive unit 10 may generate a magnetic flux having magnitude and direction. The magnetic flux may pass through the surroundings of the conductive unit 20 to induce an electromagnetic force (EMF) so that the second conductive unit 20 may generate current.

As described above, when two conductive units are adjacent to each other, a current variation of one of the two conductive units results in a generation of the induced EMF in the other adjacent conductive unit so that current is generated in the other adjacent conductive unit, which is referred to as a mutual induction phenomenon. A principle of the mutual induction phenomenon is obvious to one of ordinary skill in the art to which the embodiments pertain, and thus a description thereof is omitted.

Magnitude of the EMF induced to the second conductive unit 20 due to the current change in the first conductive unit 10 is shown as equation 1 below.

$$E_2 = -M\frac{dI_1}{dt} \quad \text{[Equation 1]}$$

In this regard, $E_2$ may denote the magnitude of the EMF induced to the second conductive unit 20, M may be a mutual induction coefficient between the first conductive unit 10 and the second conductive unit 20, $I_1$ may be current flowing through the first conducive unit 10, and t may be time.

According to equation 1 above, the magnitude of the EMF induced to the second conductive unit 20 may vary in proportional to a temporal change in the current flowing through the first conducive unit 10. The mutual induction coefficient may be a number of flux interlinkage that occurs in the second conductive unit 20 when normal current of a unit 1 flows through the first conductive unit 10. This value may be determined as predetermined constant according to a pattern of each of the first conductive unit 10 and the second conductive unit 20, mutual locations of the first conductive unit 10 and the second conductive unit 20, magnetic permeability of peripheral materials of the first conductive unit 10 and the second conductive unit 20, and the like. For example, the mutual induction coefficient may be determined according to a distance between the first conductive unit 10 and the second conductive unit 20.

For example, in a case where the first conductive unit 10 and the second conductive unit 20 have the pattern shown in FIG. 2A, the signal input unit 51 may input first current to the first conductive unit 10 connected to the lower electrodes 111 and 11n. Accordingly, the first conductive unit 10 having the pattern shown in FIG. 2A may generate a magnetic flux in a y-axis direction according to Faraday's Law. The magnetic flux generated in the y-axis direction by the first conducive unit 10 may induce the EMF in the y-axis direction of the second conductive unit 20 according to the mutual inductance phenomenon. Second current may be generated in the second conductive unit 20 according to the EMF induced to the second conductive unit 20.

The first current and the second current that vary in magnitude may be alternating current. According to another exemplary embodiment, the first current and the second current may be current that varies in magnitude according to a combination of ramp functions. However, the examples of the first current and the second current are not limited thereto, and may be any functions that continuously vary in magnitude.

For another example, in a case where the first conductive unit 10 and the second conductive unit 20 have a coil pattern based on one of the patterns shown in FIGS. 3A and 4A, the signal input unit 51 may apply first current to the first conductive unit 10. Accordingly, the first conductive unit 10 having the pattern of FIG. 3A or 4A may generate a magnetic flux in an x-axis direction according to the Faraday's Law. The magnetic flux generated in the x-axis direction by the first conducive unit 10 may induce the EMF in the x-axis direction of the second conductive unit 20 according to the mutual inductance phenomenon. Second current may be generated in the second conductive unit 20 according to the EMF induced to the second conductive unit 20.

The bending sensing unit 54 may obtain the signal output by the second conductive unit 20 from the signal output unit 52 and sense bending of the display device 1 from the signal. As described above, the second current flowing through the second conductive unit 20 may be generated by the first current flowing through the first conductive unit 10, and a relationship between the first current and the second current may depend on the mutual induction coefficient M, as seen in equation 1 above. Also, as described above, the mutual induction coefficient M is the constant determined according to various parameters, in particular, according to the distance between the first conductive unit 10 and the second conductive unit 20.

If the display device 1 is bent, the distance between the first conductive unit 10 and the second conductive unit 20 included in both sides of the non-display unit 40 of the display device 1 changes, and accordingly, the mutual induction coefficient M between the first conductive unit 10 and the second conductive unit 20 changes, and thus the relationship between the first current and the second current changes.

Therefore, the bending sensing unit 54 may calculate the distance between the first conductive unit 10 and the second conductive unit 20 from the relationship between the first current that is input to the first conductive unit 10 by the signal input unit 51 and the second current that is output from the second conductive unit 20 obtained by the signal output unit 52. Also, the bending sensing unit 54 may sense the bending of the display unit 1 or a modified shape of the display device 1 from the distance between the first conductive unit 10 and the second conductive unit 20 calculated from the bending sensing unit 54.

For example, the bending sensing unit 54 may calculate a distance between a left side and a right side of the non-display unit 40 based on magnitude changes of the first current that is input to the first conductive unit 10 disposed at the left side of the non-display unit 40 and the second current that is induced to the second conducive unit 20 disposed at the right side of the non-display unit 40, and sense the left and right bending of the display device 1 from the distance. The magnitude changes of the first current and the second current depend on a change in the distance between the first conductive unit 10 and the second conductive unit 20 by the bending of the display device 1.

According to another exemplary embodiment, the bending sensing unit 54 may calculate a distance between upper and lower ends of the non-display unit 40 based on the magnitudes of the first current that is input to the first conducive unit 10 disposed at the upper end of the non-display unit 40 and the second current that is induced to the second conductive unit 20 disposed at the lower end of the non-display unit 40, and sense the up and down bending of the display device 1 from the distance.

For example of a case where the first conductive unit 10 and the second conductive unit 20 are formed in the left and right sides of the non-display unit 40, respectively, and a third conductive unit (not shown) and a fourth conductive unit (not shown) are formed in the upper and lower ends of the non-display unit 40, respectively, the bending sensing unit 54 may sense horizontal and vertical bending of the display device 1 based on magnitudes of the first current that is input to the first conductive unit 10, third current that is input to the conductive unit, the second current that is input to the second conductive unit 20, and fourth current that is input to the fourth conductive unit, and sense a 3D modification of the display device 1 from the horizontal and vertical bending.

According to another exemplary embodiment, the bending sensing unit 54 may calculate spaces between the second through fourth conductive units of the first conductive unit 10 based on magnitudes of the first current that is input to the first conductive unit 10 disposed in the left of the non-display unit 40, and the second through fourth currents that are induced to the second through fourth conductive units formed in parallel to the first conductive unit 10, and the bending sensing unit 54 may sense the 3D modification of the display device 1 from the calculated spaces.

The control unit 53 may control the display device 1 based on the bending of the display device 1 sensed by the bending sensing unit 54. For example, the control unit 53 may control an image displayed on the display unit 30 so as to compensate for an image distortion of the display device 1 that is modified. The image distortion may be a brightness distortion, a chrominance distortion, etc., but the embodiments are not limited thereto.

According to another exemplary embodiment, the control unit 53 may provide a user interface based on the bending of the display device 1 sensed by the bending sensing unit 54. For example, the control unit 53 analyzes the bending of the display device 1 as intending a touch input of a touch panel included in the display unit 30 or a modification of the image displayed on the display unit 30, and provide the user interface according to the analysis.

Although the driving unit 50 of FIG. 5 may be included in a lower end of the display device 1 as shown in FIG. 1, embodiments are not limited thereto. The driving unit 50 may be included in an upper end of the display device 1. According to another exemplary embodiment, the driving unit 50 may be separately included in the upper and lower ends of the display device 1. According to yet another exemplary embodiment, the driving unit 50 may be included in a left side or a right side of the display device 1 or may be separately included in the left and right sides of the display device 1.

Figure 6:
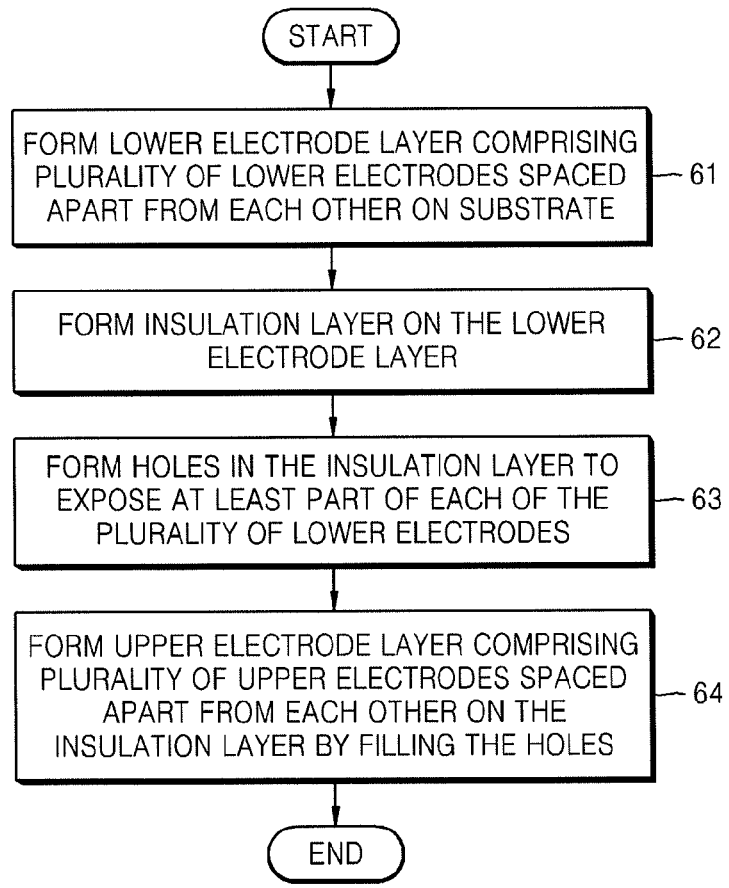
FIG. 6 is a flowchart of a method of manufacturing a display device according to an exemplary embodiment.

FIG. 6 is a flowchart of a method of manufacturing a display device according to an embodiment.

Referring to FIG. 6, in operation 61, a lower electrode layer including a plurality of lower electrodes that are spaced apart from each other may be formed on a substrate of non-display units of both sides of the display device. In this regard, the lower electrode layer may be formed of the same material as that of a gate electrode of a TFT of a display unit of the display device simultaneously with the formation of the gate electrode.

In operation 62, an insulation layer may be formed on the lower electrode layer.

In operation 63, holes may be formed in the insulation layer to expose at least a part of each of the lower electrodes.

In operation 64, an upper electrode layer including a plurality of upper electrodes that are spaced apart from each other may be formed on the insulation layer by filling the holes. For example, the upper electrode layer may be formed of the same material as that of source and drain electrodes of the TFT of the display unit of the display device simultaneously with the formation of the source and drain electrodes.

At least two conductive units including the lower electrode layer, the insulation layer, and the upper electrode layer may be formed to face each other on a substrate of a non-display unit disposed at a boundary of the display device. At least one of the lower electrode layer and the upper electrode layer may have a whirlpool pattern that is gradually far away from a center point and rotates.

The conductive units may be formed in coil shapes as the lower electrode layer and the upper electrode layer are connected to each other. Each of the lower electrodes may have a long pattern disposed in a first direction of the display device. Each of the upper electrodes may have a long pattern disposed inclined at a predetermined angle from the first direction of the display device.

Each of the upper electrodes may be connected to at least two of the lower electrodes through the holes so that the at least two of the lower electrodes may be electrically connected to each other. Each of the lower electrodes may be connected to at least two of the upper electrodes through the holes so that the at least two of the upper electrodes may be electrically connected to each other, and thus the conductive units may be electrically connected from one ends thereof to other ends thereof.

Figure 7:
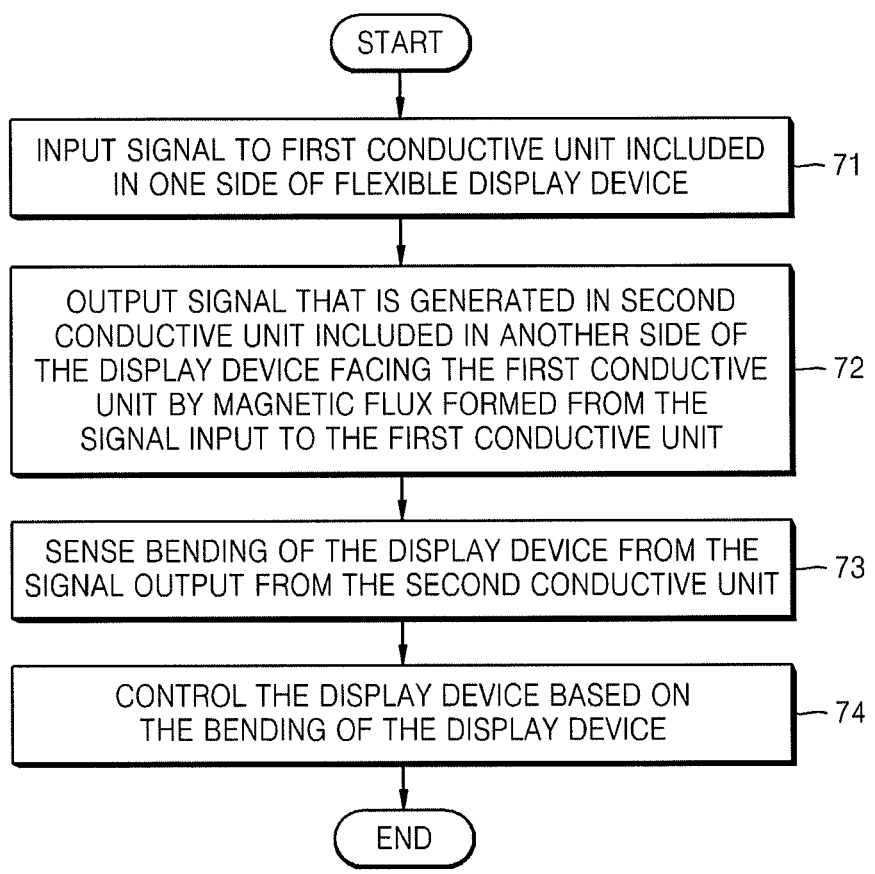
FIG. 7 is a flowchart of a bending sensing method according to an exemplary embodiment.

FIG. 7 is a flowchart of a bending sensing method according to an embodiment. In operation 71, a signal may be input to a first conductive unit included in one side of a flexible display device. For example, in operation 71, the signal input unit 51 may input first current to the first conductive unit.

In operation 72, a signal that is generated in a second conductive unit included in another side of the display device facing the first conductive unit may be output according to a magnetic flux formed from the signal input to the first conductive unit. For example, in operation 72, the signal output unit 52 may output second current that is generated in the second conductive unit according to a magnetic flux formed with respect to a change in the magnitude of the first current.

In operation 73, bending of the display device may be sensed from the signal output from the second conductive unit. For example, in operation 73, the bending sensing unit 54 may sense the bending of the display device based on a change in the magnitude of the second current with respect to a distance between the first conductive unit and the second conductive unit by the bending of the display device. In operation 74, the control unit 53 may control the display device based on the bending of the display device sensed in operation 73.

According to the above-described embodiments, a bending sensing device capable of sensing a bending degree of a flexible display device may be manufactured by using a mutual inductance. Further, the bending degree of the flexible display device may be sensed using the mutual inductance. Further, the display device 1 may be controlled based on sensed bending information, thereby enhancing user convenience.

Further, the bending sensing method according to an embodiment shown in FIG. 7 can also be embodied as computer-readable codes on a computer-readable recording medium. The computer-readable recording medium is any data storage device that can store data which can be thereafter read by a computer system. Examples of the computer-readable recording medium include read-only memory (ROM), random-access memory (RAM), CD-ROMs, magnetic tapes, floppy disks, optical data storage devices, etc. The computer-readable recording medium can also be distributed over network-coupled computer systems so that the computer-readable code is stored and executed in a distributed fashion.

The organic light-emitting display apparatuses may be implemented as flexible display apparatuses by using a plastic substrate and may become more flexible by reducing the thickness of a display panel. The flexible display may be used as a flat flexible display as well as may be used as a modified 3D flexible display owing to its flexibility.

Further, such 3D flexible display may be modified in various ways according to users or the circumstances in which the flexible display is used. Accordingly, a method of sensing a modification such as bending or folding of the flexible display and controlling an output image of the flexible display or providing a user interface based on the sensing of the modification is sought.

According to the one or more embodiments, a bending degree of a flexible display device may be sensed using a mutual inductance. Embodiments relates to a method and apparatus for sensing bending of a flexible display device and a method of manufacturing the flexible display device. Further, embodiments relate to a method and apparatus for sensing bending of a flexible display device using a mutual inductance. Embodiments also relate to a method and apparatus for manufacturing a flexible display device including a bending sensing unit.

While embodiments have been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a flexible display device for sensing bending thereof, the method comprising:
   forming a lower electrode layer that includes a plurality of lower electrodes spaced apart from each other on a substrate;
   forming an insulation layer on the lower electrode layer;
   forming holes in the insulation layer to expose at least a part of each of the plurality of lower electrodes; and
   forming an upper electrode layer that includes a plurality of upper electrodes that are spaced apart from each other and on the insulation layer and that fill entire lengths of the holes in the insulation layer to electrically connect the upper electrodes and the lower electrodes,
   wherein at least two conductive units including the lower electrode layer, the insulation layer, and the upper electrode layer are formed to face each other on a substrate of a non-display unit that is arranged near a boundary of the display device.

2. The method of claim 1, wherein at least one of the lower electrode layer and the upper electrode layer includes an electrode having a whirlpool pattern that gradually extends farther away from a center point.

3. The method of claim 1, wherein the at least two conductive units are formed in coil shapes as the lower electrode layer and the upper electrode layer are connected to each other.

4. The method of claim 3, wherein each of the plurality of lower electrodes are formed to have a long pattern extending in a first direction of the display device, and each of the plurality of upper electrodes are formed to have a long pattern inclined at a predetermined angle from the first direction of the display device.

5. The method of claim 1, wherein the upper electrode layer is formed of a same material as source and drain electrodes of a thin film transistor (TFT) of a display unit of the display device, simultaneously with a formation of the source and drain electrodes.

6. The method of claim 1, wherein the lower electrode layer is formed of a same material as a gate electrode of a thin film transistor (TFT) of the display unit of the display device, simultaneously with a formation of the gate electrode.

7. The method of claim 1, wherein:
   each of the plurality of upper electrodes is connected to at least two of the plurality of lower electrodes through the holes in the insulation layer such that the at least two of the plurality of lower electrodes are electrically connected to each other, and
   each of the plurality of lower electrodes is connected to at least two of the plurality of upper electrodes through the holes in the insulation layer such that the at least two of the plurality of upper electrodes are electrically connected to each other, and the at least two conductive units are electrically connected from one ends thereof to other ends thereof.

8. A flexible display device for sensing bending thereof, the flexible display device comprising:
   a lower electrode layer that includes a plurality of lower electrodes spaced apart from each other on a substrate;
   an upper electrode layer that includes a plurality of upper electrodes spaced apart from each other;
   an insulation layer that includes a plurality of holes on the lower electrode layer, the plurality of holes exposing at least a part of each of the plurality of lower electrodes, and the plurality of upper electrodes being on the insulation layer and filling entire lengths of the plurality of holes to electrically connect the upper electrodes and the lower electrodes; and wherein at least two conductive units including the lower electrode layer, the insulation layer, and the upper electrode layer face each other on a substrate of a non-display unit that is arranged near a boundary of the display device.

9. The flexible display device of claim 8, wherein at least one of the lower electrode layer and the upper electrode layer includes an electrode having a whirlpool pattern that gradually extends farther away from a center point.

10. The flexible display device of claim 8, wherein the at least two conductive units have coil shapes as the lower electrode layer and the upper electrode layer are connected to each other.

11. The flexible display device of claim 10, wherein each of the plurality of lower electrodes has a long pattern extending in a first direction of the display device, and each of the plurality of upper electrodes has a long pattern inclined at a predetermined angle from the first direction of the display device.

12. The flexible display device of claim 8, wherein the upper electrode layer is formed of a same material as source and drain electrodes of a thin film transistor (TFT) of a display unit of the display device, simultaneously with a formation of the source and drain electrodes.

13. The flexible display device of claim 8, wherein the lower electrode layer is formed of a same material as a gate electrode of a thin film transistor (TFT) of the display unit of the display device, simultaneously with the formation of the gate electrode.

14. The flexible display device of claim 8, wherein:

each of the plurality of upper electrodes is connected to at least two of the plurality of lower electrodes through the holes in the insulation layer such that the at least two of the plurality of lower electrodes are electrically connected to each other, and each of the plurality of lower electrodes is connected to at least two of the plurality of upper electrodes through the holes in the insulation layer such that the at least two of the plurality of upper electrodes are electrically connected to each other, and the at least two conductive units are electrically connected from one ends thereof to other ends thereof.

15. A bending sensing method, the method comprising:

inputting a signal to a first conductive unit included in one side of a flexible display device;

outputting a signal that is generated in a second conductive unit included in another side of the display device, which other side faces the first conductive unit, by a magnetic flux formed from the signal input to the first conductive unit; and sensing bending of the display device from the signal output from the second conductive unit.

16. The method of claim 15, wherein:

the inputting of the signal to the first conductive unit includes inputting first current to the first conductive unit, the outputting of the signal that is generated in the second conductive unit includes outputting second current that is generated in the second conductive unit by a magnetic flux formed by a change in a magnitude of the first current, and the sensing bending of the display device includes sensing the bending of the display device based on a change in a magnitude of the second current with respect to a change in a distance between the first conductive unit and the second conductive unit, by the bending of the display device.

17. The method of claim 15, further comprising controlling the display device based on the sensed bending of the display device.

18. A bending sensing apparatus, comprising:

a signal input unit that inputs a signal to a first conductive unit included in one side of a flexible display device;

a signal output unit that outputs a signal that is generated in a second conductive unit included in another side of the display device, which other side faces the first conductive unit, by a magnetic flux formed from the signal input to the first conductive unit; and a bending sensing unit that senses bending of the display device from the signal output from the second conductive unit.

19. The bending sensing apparatus of claim 18, wherein:

the signal input unit inputs a first current to the first conductive unit, the signal output unit outputs a second current that is generated in the second conductive unit by a magnetic flux formed by a change in a magnitude of the first current, and the bending sensing unit senses the bending of the display device based on a change in a magnitude of the second current with respect to a change in a distance between the first conductive unit and the second conductive unit, by the bending of the display device.

20. The bending sensing apparatus of claim 18, further comprising a control unit that controls the display device based on the bending of the display device sensed by the bending sensing unit.

* * * * *